United States Patent
Moser et al.

(10) Patent No.: US 7,796,965 B2
(45) Date of Patent: Sep. 14, 2010

(54) METHOD AND CIRCUIT ARRANGEMENT FOR FIELD STRENGTH DETERMINATION AND INTEGRATED CIRCUIT

(75) Inventors: Daniel Moser, Stuttgart (DE); Helmut Moser, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 651 days.

(21) Appl. No.: 11/790,492

(22) Filed: Apr. 25, 2007

(65) Prior Publication Data

US 2007/0257770 A1 Nov. 8, 2007

Related U.S. Application Data

(60) Provisional application No. 60/801,401, filed on May 19, 2006.

(30) Foreign Application Priority Data

Apr. 25, 2006 (DE) ........................ 10 2006 020 423

(51) Int. Cl.
*H04B 17/00* (2006.01)
*B60R 25/10* (2006.01)
*G08B 1/08* (2006.01)

(52) U.S. Cl. .............. 455/226.2; 455/41.1; 340/426.36; 340/539.13; 340/539.21

(58) Field of Classification Search ................ 455/41.1, 455/63.1, 67.11, 226.1, 226.2, 404.2, 456.1, 455/456.6; 340/426.22, 426.28, 426.36, 340/500, 524, 539.13, 539.21
See application file for complete search history.

(56) References Cited

U.S. PATENT DOCUMENTS 2,295,629 A 9/1942 Bond 2,489,908 A 11/1949 Larrick (Continued)

FOREIGN PATENT DOCUMENTS

DE 101 59 551 A1 6/2003

(Continued)

OTHER PUBLICATIONS

Klaus Finkenzeller; "Inductive Coupling", RFID-Manual, $3^{rd}$ edition, Hanser 2002, pp: 42-45.

(Continued)

*Primary Examiner*—Duc M Nguyen
(74) *Attorney, Agent, or Firm*—Muncy, Geissler, Olds & Lowe, PLLC

(57) ABSTRACT

Method and Circuit Arrangement for Field Strength Determination and Integrated Circuit is provided. In the method of the invention for determining the field strength of a carrier signal at an antenna of an antenna circuit of an electronic key, whereby the antenna circuit generates an output value, which is a function of the field strength and a function of characteristic parameters of the antenna circuit, comprises the steps: generation of a reference input value, supplying the antenna circuit with the reference input value, measurement of the characteristic parameters, while the antenna circuit is supplied with the reference input value, storage of the characteristic parameters, measurement of a first output value of the antenna circuit, and determination of the field strength from the first output value and the characteristic parameters, whereby an effect of the characteristic parameters on the field strength is compensated. Use, for example, in motor vehicles.

18 Claims, 2 Drawing Sheets

U.S. PATENT DOCUMENTS

| | | | | |
|---|---|---|---|---|
| 4,272,719 | A * | 6/1981 | Niki et al. | 324/72 |
| 4,314,251 | A * | 2/1982 | Raab | 342/463 |
| 4,619,002 | A * | 10/1986 | Thro | 455/226.2 |
| 4,642,786 | A * | 2/1987 | Hansen | 702/153 |
| 5,193,210 | A * | 3/1993 | Nicholas et al. | 455/226.3 |
| 5,723,911 | A * | 3/1998 | Glehr | 340/10.5 |
| 6,150,811 | A | 11/2000 | Grill et al. | 324/258 |
| 6,259,918 | B1 * | 7/2001 | Labonte et al. | 455/437 |
| 6,300,882 | B1 * | 10/2001 | Inoue | 340/933 |
| 6,747,545 | B2 | 6/2004 | Nowottnick et al. | |
| 6,809,638 | B2 * | 10/2004 | Lin | 340/447 |
| 6,922,553 | B2 | 7/2005 | Blatz et al. | |
| 7,120,564 | B2 * | 10/2006 | Pacey | 702/193 |
| 7,602,274 | B2 * | 10/2009 | Lee et al. | 340/10.2 |
| 2001/0033222 | A1 * | 10/2001 | Nowottnick et al. | 340/5.61 |
| 2007/0139171 | A1 | 6/2007 | Fischer | |
| 2007/0257771 | A1 * | 11/2007 | Moser et al. | 340/5.61 |

FOREIGN PATENT DOCUMENTS

| | | |
|---|---|---|
| EP | 1808818 A1 | 7/2007 |
| EP | 1136955 A2 | 9/2007 |
| GB | 2 307 050 A | 5/1997 |

OTHER PUBLICATIONS

Klaus Finkenzeller; RFID-Manual, 3$^{rd}$ edition, Hanser 2002, pp: 72-73, and 77.

Atmel, "Wireless Control Systems", Data Book 2001, ICs, p. 326.

Klaus Finkenzeller; "Measurement of system parameters" RFID-Manual, 3$^{rd}$ edition, Hanser 2002, pp: 103-104.

* cited by examiner

METHOD AND CIRCUIT ARRANGEMENT FOR FIELD STRENGTH DETERMINATION AND INTEGRATED CIRCUIT

This nonprovisional application claims priority to German Patent Application No. DE 102006020423, which was filed in Germany on Apr. 25, 2006, and to U.S. Provisional Application No. 60/801,401, which was filed on May 19, 2006, and which are both herein incorporated by reference.

BACKGROUND OF THE INVENTION

1. Field of the Invention

The present invention relates to a method and a circuit arrangement for field strength determination and to an integrated circuit.

2. Description of the Background Art

In remote keyless entry systems for motor vehicles, an unlocking of the vehicle occurs not with a mechanical key, but with an electronic key medium or an electronic key, for example, in the shape of a molded article, on which actuation elements are arranged. One or more integrated circuits, which realize the function of the electronic key medium or of the electronic key, are arranged on or in the key medium.

A so-called base station, which communicates or exchanges data with the electronic key in a wireless manner, is placed in the motor vehicle as a counterpart to the electronic key.

To unlock or lock the motor vehicle, a user actuates an associated control element on the electronic key, as a result of which a data transmission is initiated between the electronic key or its integrated circuit and the base station. If the information transmitted between the base station and the electronic key corresponds to a stipulated protocol and has the expected content, the motor vehicle is unlocked with the aid of the base station.

In passive entry/passive go systems or passive entry go (PEG) systems, actuation of the key to lock or unlock the motor vehicle is no longer necessary. The user of the motor vehicle must only keep an electronic key medium with him, for example, in form of a card.

When the user operates a door handle of the motor vehicle, this is detected in the motor vehicle and reported to the base station. The base station thereupon transmits a low-frequency carrier signal, for example, with a frequency of 125 kHz, to the electronic key medium. In addition, data may also be transmitted to the electronic key medium by the low-frequency carrier signal.

To receive the low-frequency carrier signal, the key medium has an antenna circuit with an antenna, for example, in the form of a coil, whereby the antenna circuit generates an output value, for example, a voltage, which is a function of the field strength and a function of characteristic parameters of the antenna circuit.

An exemplary circuit arrangement for obtaining field strength information or for determining the field strength is described in German Patent Application DE 101 59 551 A1, which corresponds to U.S. Pat. No. 6,922,553, and which is incorporated herein by reference. The output value is used to determine the distance of the key medium from the base station or from one or more transmitting antennas.

If more than one transmitting antenna is provided at different positions, for example, in a front area and in a back area, of the motor vehicle, the position of the user or the key medium relative to the motor vehicle can also be determined by so-called triangulation based on two determined distances from the particular antennas.

To determine the field strength independent of an orientation or position of the key medium relative to the transmitting antenna of the base station, devices are known in which three antenna coils, each perpendicular to one another, are provided. The specific field strengths of the antenna coils are vectorially superposed to calculate a resulting field strength.

When the distance between the antenna of the base station and the antenna of the key medium antenna circuit has been determined, it is then verified whether the determined distance lies within a permitted tolerance range. If this is the case, access to the motor vehicle is made possible by unlocking all or only certain locks. The unlocking of only certain locks can be made dependent on the position of the user relative to the motor vehicle.

If the user then enters the motor vehicle and operates a start button to start the engine, a distance or position determination is performed in the key medium also based on a field strength measurement. If the position determination indicates that the user is in the required position for starting the engine, the engine is started.

Apart from the access control and the engine start, there are numerous other application scenarios in which a distance measurement is made, for example, when the user climbs out of the motor vehicle and moves away from it.

It becomes clear from the above statements that there are high requirements for the distance or position measurement based on field strength determination of the carrier signal in the key medium.

As stated above, for the distance measurement an output value is generated by the antenna circuit, for example, an output voltage, which is a function of the field strength and a function of the characteristic parameters of the antenna circuit. The characteristic parameters of a particular antenna circuit represent the tolerances, production variations, and other specific properties of the components of the particular antenna circuit.

Because each antenna circuit has its specific characteristic parameters, which can deviate considerably from one another in practice, different antenna circuit output voltages result in different antenna circuits at identical field strength. If, for example, an atypical table is provided in the particular key medium for distance calculation, in which an assignment of the output voltage to field strength is stored, this can lead to obvious errors in the distance calculation.

In order to take this problem into account, a laborious calibration of the key media or the antenna circuits usually takes place during a manufacturing process. For this purpose, for example, a known reference field strength can be predefined from outside by a calibration station, which is used to generate a calibration value in the particular key medium. This method is very laborious and takes into account only the parameter situation during the calibration process. A change in the characteristic parameters by long-term effects, temperature, and variable operating voltage cannot be detected by calibration during the manufacturing process; i.e., the distance measurement becomes accordingly poorer with such long-term effects.

Another major problem is that the antenna circuit or its antenna is more greatly dampened depending on metallic objects in its environment, for example, a bunch of keys; as a result, its characteristic parameters are also substantially changed depending on the situation. These effects as well cannot be detected by calibration during the manufacturing process.

SUMMARY OF THE INVENTION

It is therefore an object of the present invention to provide a method for determining the field strength of a carrier signal, a circuit arrangement for determining the field strength of a carrier signal, and an integrated circuit, which enable a precise, long-term stable field strength measurement, without requiring a laborious calibration during a manufacturing process.

In the method for determining the field strength of a carrier signal, at an antenna of an antenna circuit of an electronic key, the antenna circuit generates an output value, which is a function of the field strength and a function of characteristic parameters of the antenna circuit. The characteristic parameters of a particular antenna circuit represent the tolerances, production variations, and other specific properties of the components of the particular antenna circuit. According to the invention, the characteristic parameters are measured in the electronic key based on a reference input value generated within the electronic key itself; here, the antenna circuit during the measurement of the characteristic parameters is supplied with the reference input value—i.e., the reference input value serves as the input value of the antenna circuit during the measurement. Then, the characteristic parameters are saved. After this, a first, field-induced output value of the antenna circuit is measured, the antenna circuit not being supplied with the reference input value during the measurement of the first output value. The field strength is determined from the first output value and the characteristic parameters, an effect of the characteristic parameters on the field strength being compensated. The measurement of the characteristic parameters can occur in a cyclic manner, as a result of which a continuous calibration of the antenna circuit can occur. The generation of the in-circuit reference input value enables a calibration also without a laborious calibration process during manufacture. Because the calibration can take place continuously, a precise, long-term stable field strength measurement is possible, which also takes into account changed conditions in the surroundings, for example, metallic objects in the vicinity of the key medium or of the antenna circuit.

In a development of the method, the reference input value is generated in the form of a reference input voltage and/or a reference input current with a predefined reference frequency and reference amplitude; a second output value is measured with an applied reference input value, and the characteristic parameters are determined from the second output value. The characteristic parameters can be identical to the second output value or the second output value can be a measure for the characteristic parameters. Preferably, to determine the field strength, the quotient is formed from the first, field-strength-determined output value and the second, reference input value-determined output value.

In a development of the method, the reference frequency is set equal to a frequency of the carrier signal. In this way, the characteristic parameters are determined by the reference value at the appropriate operating frequency.

In a development of the method, the reference frequency is derived from a frequency of the carrier signal. It can be assured in this way that the calibration takes place by means of the reference input value also at the actual operating frequency of the antenna circuit.

In a development of the method, a distance between the antenna and a transmitting antenna of a transmitter of the carrier signal is determined from the determined field strength. Preferably, within the context of the distance determination, the field strength is determined in addition at a second antenna and at a third antenna of the antenna circuit, whereby the antennas are each perpendicular to one another and a distance between the antennas and a transmitting antenna of a transmitter of the carrier signal is determined from the determined field strengths by superposition. Vectorial superposition of the field strengths calculated per antenna makes it possible to calculate the distance independent of an orientation of the antennas or of the key medium relative to the transmitting antenna.

In a development of the method, the antenna and a transmitting antenna of a transmitter of the carrier signal are mutually coupled. For mutual or inductive coupling, reference is made to the manual of Klaus Finkenzeller, RFID-Handbuch [RFID Manual], 3rd ed., HANSER, 2002; see in particular Chapter 3.2.1 "Inductive Coupling", pages 42 to 45.

In a development of the method, a parallel resonant circuit or a series resonant circuit is formed by the antenna circuit.

In a development of the method, the frequency of the carrier signal is within a range of 50 KHz to 150 KHz or within a range of 5 MHz to 25 MHz.

The circuit arrangement of the invention for determining the field strength of a carrier signal has an antenna circuit with an antenna and an output terminal, at which an output value is applied in the form of an output voltage and/or an output current, which is a function of the field strength and a function of characteristic parameters of the antenna circuit. According to the invention, a reference input value generating unit for generating a reference input value is provided in the form of a reference input voltage and/or a reference input current with a known reference frequency and reference amplitude, as well as an activatable switching unit, coupled to the antenna circuit and the reference input value generating unit, which supplies the antenna circuit with the reference input value as a function of the activation state or decouples the antenna circuit from the reference input value.

In a development of the circuit arrangement, the reference input value generating unit is an oscillator. The oscillator may comprise, for example, a PLL, quartzes, voltage-controlled oscillators, etc.

In a development of the circuit arrangement, said arrangement comprises an evaluation unit, which is designed in such a way that it evaluates an output value when a reference input value is not applied and an output value when a reference input value is applied for determining the field strength. The evaluation unit may be, for example, a microcontroller with a low power requirement.

In a development of the circuit arrangement, the antenna circuit has an antenna coil and a capacitor, which together form a parallel resonant circuit.

In a development of the circuit arrangement, the switching unit has a first switch, which is looped between a terminal of the capacitor and a reference potential, particularly ground, and a second switch, which is looped between the terminal of the capacitor and a terminal of the reference input value generating unit, at which the reference input value is applied. The switches are activated in such a way that the reference input value serves as an input value of the antenna circuit, when the characteristic parameters are determined, and that the antenna circuit is decoupled from the reference input value or the reference input value generating unit, when the field strength is measured.

In a development of the circuit arrangement, the antenna circuit is designed for mutual coupling to a transmitting antenna of a transmitter of the carrier signal.

The integrated circuit of the invention for a key medium of a passive entry and/or a passive go system is designed for coupling to a circuit arrangement.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
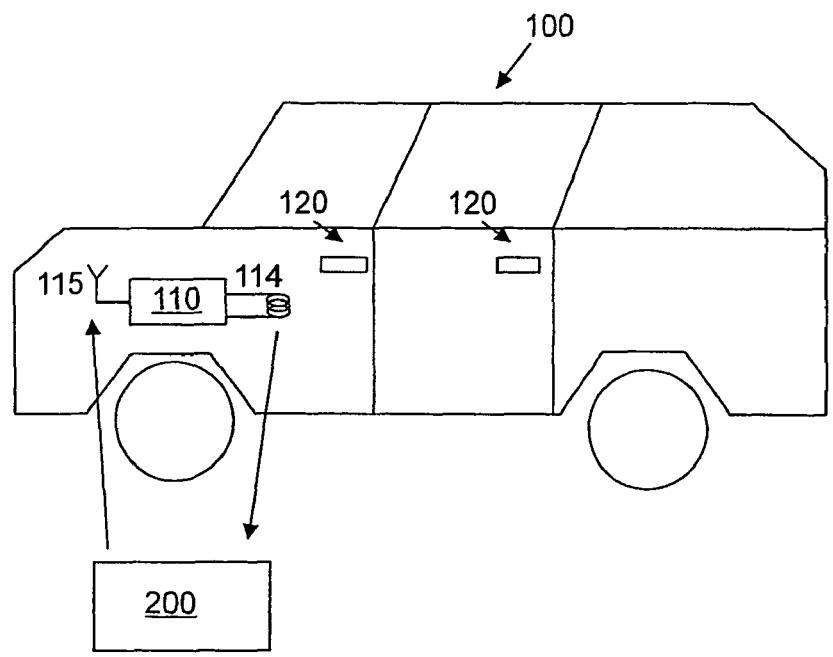
FIG. 1 illustrates a block diagram of a passive entry/passive go system for automatic, distance-dependent unlocking and/or locking and for keyless starting of a motor vehicle.

FIG. 1 shows a block diagram of a passive entry/passive go (PEG) system for automatic, distance-dependent unlocking and/or locking and for keyless starting of a motor vehicle 100.

The PEG system comprises a base station 110, which is placed in motor vehicle 100, and at least one card-shaped, electronic key medium 200 assigned to base station 110.

If a user (not shown) of key medium 200 operates a door handle 120 of motor vehicle 100, this is detected in motor vehicle 100 and reported to base station 110, for example, via a motor vehicle bus system (not shown). Base station 110 thereupon transmits a low-frequency (LF) carrier signal with a frequency of 125 kHz over an LF antenna of base station 110 in the form of a coil 114 to electronic key medium 200. Key medium 200, after receiving the LF carrier signal and a distance determination using the LF carrier signal field strength, calculated in the key medium 200, transmits a signal with unlocking information in a UHF frequency range to base station 110, when the determined or calculated distance is within a permissible range. The UHF signal is received by a UHF antenna 115 of base station 110, and when the information transmitted from key medium 200 to base station 110 conforms with the protocol, motor vehicle 100 is unlocked, and the user can sit, for example, on a driver's seat (not shown) of motor vehicle 100.

To start motor vehicle 100, the user presses a start button, whereupon the low-frequency LF carrier signal is again transmitted to key medium 200. After a repeated distance or position calculation in key medium 200, during which it is verified whether the user is sitting in a driver's seat (not shown), a start release is transmitted by key medium 200, again via the UHF channel, to base station 110.

The UHF transmission is based on a so-called far-field coupling and the LF transmission on an inductive or mutual coupling in the near field. If more than one antenna 114 is placed at different positions in motor vehicle 100, apart from a distance measurement, a position measurement relative to motor vehicle 100 can also be made by determining the respective antenna field strength, calculation of the distance to the respective antenna from the field strength, and subsequent triangulation.

Figure 2:
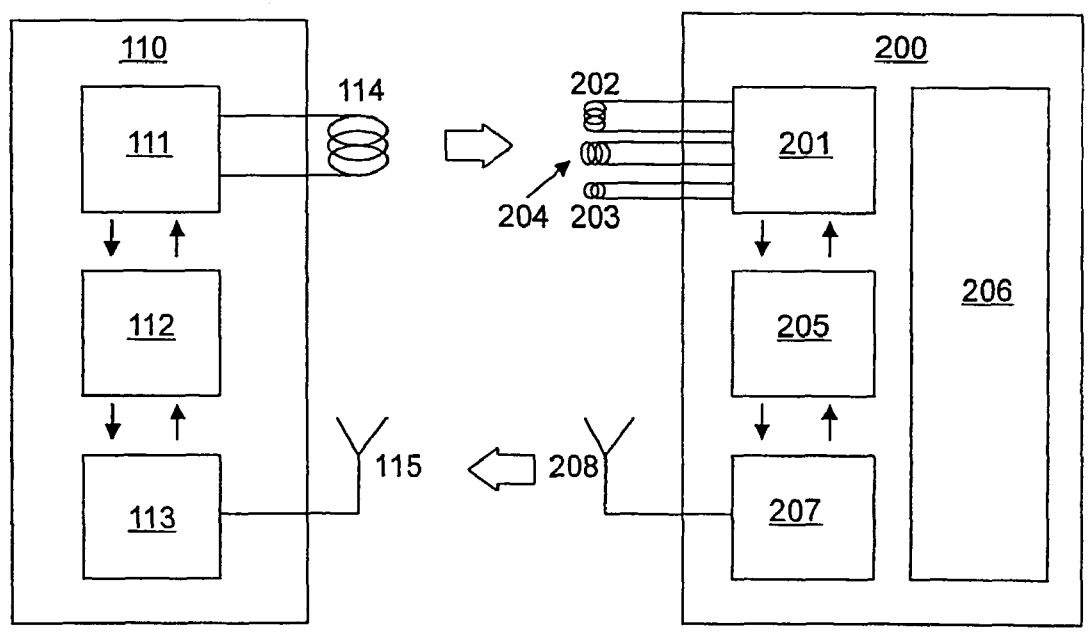
FIG. 2 illustrates a detailed block diagram of a key medium and a base station of FIG. 1.

FIG. 2 shows a detailed block diagram of key medium 200 and base station 110 of FIG. 1.

Base station 110 comprises an LF transmitter/receiver 111 and LF antenna 114 in the form of a coil, connected to LF transmitter/receiver 111, a UHF transmitter/receiver 113, a UHF antenna 115, connected to UHF transmitter/receiver 113, and a microprocessor 112, which is coupled to LF transmitter/receiver 111 and UHF transmitter/receiver 113 and exchanges data, to be transmitted and received bidirectionally, with said transmitter/receiver.

Key medium 200 comprises an LF transmitter/receiver 201 for a so-called 3D reception, to which antennas 202, 203, and 204 are connected in the form of coils. The antenna coils or symmetry axes in the winding direction of antenna coils 202, 203, and 204 are each perpendicular to one another. The field strengths calculated per antenna can be interpreted as components of a three-dimensional field strength vector, whose contribution has a value dependent on the distance of key medium 200 from transmitting antenna 114 of base station 110, but the value is independent of an orientation of key medium 200 relative to transmitting antenna 114.

For UHF transmission, key medium 200 has a UHF transmitter/receiver 207 and a UHF antenna 208 connected to UHF transmitter/receiver 207.

Furthermore, key medium 200 has a microprocessor 205, which is coupled to LF transmitter/receiver 201 and UHF transmitter/receiver 207 and exchanges data, to be transmitted and received bidirectionally, with said transmitters/receivers, and a battery or an accumulator 206 for supplying power. LF transmitter/receiver 201 in addition outputs a field strength signal, associated with each of antennas 202, 203, and 204, to microprocessor 205.

In the simplest case, an LF data transmission occurs unidirectionally from base station 110 to key medium 200, whereby in this case, unit 111 is only a transmitter and unit 201 only a receiver. Accordingly, the UHF data transmission can occur unidirectionally from key medium 200 to base station 110, whereby in this case, unit 207 is only a transmitter and unit 113 only a receiver. In the shown exemplary embodiment, both the LF data transmission and the UHF data transmission occur bidirectionally.

Figure 3:
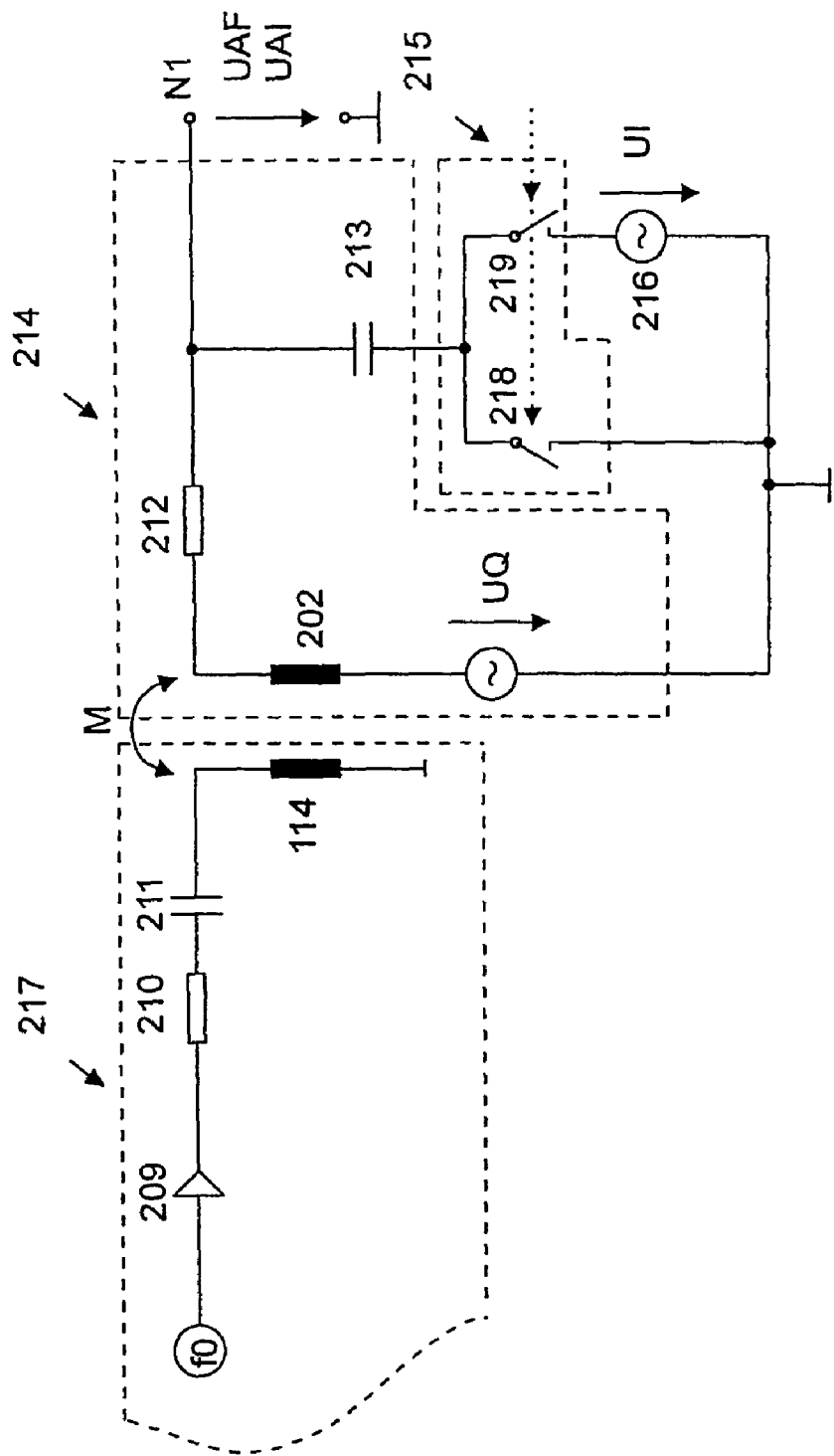
FIG. 3 illustrates a detailed block diagram of an antenna circuit of an LF transmitter/receiver of FIG. 2.

FIG. 3 shows a detailed block diagram of an antenna circuit 214 of LF transmitter/receiver 201 of FIG. 2. For reasons of clarity, only the antenna circuit which is assigned to antenna 202 is shown in FIG. 3. Antennas 203 and 204 are assigned corresponding antenna circuits (not shown).

Antenna circuit 214 comprises antenna or antenna coil 202, a resistor 212, which represents a parasitic copper resistor of antenna coil 202, and a capacitor 213. Antenna coil 202 and capacitor 213 form a parallel resonant circuit. An output value, which during normal operation is a function of the field strength of the LF carrier signal and a function of characteristic parameters of antenna circuit 214, is applied at the output terminal N1 in the form of an output voltage UAF or UAI. The output voltage UAF or UAI is used as an analog input value for an A/D converter (not shown) of microprocessor 205 and is processed further digitalized in said microprocessor.

The operation of the arrangement shown in FIG. 3 will be described in detail next. In a transmission unit 217 of base station 110, which is shown only as a detail, a signal with a frequency f0 is provided via a driver stage 209. The signal is supplied to a series resonant circuit with transmitting antenna coil 114, a resistor 210, and a capacitor 211. A voltage UQ is induced in antenna coil 202 by a magnetic carrier field generated in transmitting antenna coil 114. The following formulas describe in mathematic terms the coupling between antenna coils 114 and 202. They are derived from the manual Klaus Finkenzeller, RFID-Handbuch [RFID Manual], 3rd ed., HANSER, 2002; see particularly pages 72, 73, and 77.

$$UQ = \omega_0 * k\sqrt{L1*L2} * i_1 \quad (1)$$

In Equation (1), UQ designates a voltage induced in coil 202; $\omega_0$ is the angular frequency assigned to the transmission frequency f0, k is a coupling factor, L1 is an inductance of antenna coil 114, L2 is an inductance of antenna coil 202, and $i_1$ is a current through transmitting antenna coil 114.

The voltage UQ induced in antenna coil 202 generates the following output voltage UAF:

$$UAF = \frac{UQ}{\sqrt{(\omega_0 * R2 * C2)^2 + (1 - \omega_0^2 * L2 * C2)^2}} \quad (2)$$

Equation (2), in comparison with the formula in Finkenzeller, contains the simplified assumption that an RL=∞, as a result of which a term with RL is eliminated in the denominator. R2 designates a resistance value of resistor 212 and C2 designates a capacitance of capacitor 213.

Equation (2) shows directly that the output voltage UAF, produced by the field of the carrier signal, is determined by the value R2 of resistor 212, the inductance L2 of receiving coil 202, and the capacitance C2 of capacitor 213. These values therefore form the characteristic parameters of antenna circuit 214.

To determine the characteristic parameters or a measure for the characteristic parameters or a characteristic quantity for the characteristic parameters, which represents their output voltage-relevant properties, antenna circuit 214 is supplied with a reference input value. The reference input value is generated in the form of a reference input voltage UI by a reference input value generating unit in the form of an oscillator 216, which is part of LF transmitter/receiver 201 of FIG. 2. The frequency of the reference input voltage UI is the same as frequency f0 of the carrier signal. The amplitude of the reference input voltage UI is generated precisely with a previously known value.

For measuring the characteristic parameters, a switching unit 215, activated by microprocessor 205, with a first switch 218 and a second switch 219, is activated in such a way that switch 218 is opened and switch 219 is closed. This has the result that antenna circuit 214 is supplied with the reference input value UI as a simulated input voltage. The signal generated by transmitting unit 217 is turned off during the measurement of the characteristic parameters, i.e., UQ=0. Switching unit 215 is part of LF transmitter/receiver 201 of FIG. 2.

An output voltage UAI arising at output terminal N1 of antenna circuit 214 can be calculated using the following equation:

$$UAI = \frac{UI}{\sqrt{(\omega_0 * R2 * C2)^2 + (1 - \omega_0^2 * L2 * C2)^2}} \quad (3)$$

If a quotient is formed from the first output value UAF and the second output value UAI, the following equation results:

$$\frac{UAF}{UAI} = \frac{\frac{UQ}{\sqrt{(\omega_0 * R2 * C2)^2 + (1 - \omega_0^2 * L2 * C2)^2}}}{\frac{UI}{\sqrt{(\omega_0 * R2 * C2)^2 + (1 - \omega_0^2 * L2 * C2)^2}}} = \frac{UQ}{UI} \quad (4)$$

If Equation (4) is solved for UQ, we obtain:

$$UQ = UI * \frac{UAF}{UAI} \quad (5)$$

A distance x of the transmitting antenna or transmitting coil 114 of receiving antenna or receiving coil 202 can be calculated from the calculated voltage UQ using the following Equation (6):

$$x = \sqrt{\left(\sqrt[3]{\frac{r_{L2}^2 * r_{L1}^2}{2 * \sqrt{r_{L2} * r_{L1}} * \frac{UQ}{\omega_0 * \sqrt{L1 * L2} * i_1}}}\right)^2 - r_{L2}^2} \quad (6)$$

where $r_{L1}$ is a radius of transmitting antenna coil 114 and $r_{L2}$ a radius of receiving antenna coil 202. Equation (6) applies to air coils as transmitting antenna 114 and receiving antenna 202. If no air coils are used, Equation (6) can be modified accordingly. For this purpose, the coupling factor dependent on the distance x (by transformation of Equation (1))

$$k(x) = \frac{UQ}{\omega_0 * \sqrt{L1 * L2} * i_1}$$

In Equation (6) is to be replaced by a coupling factor valid for an employed coil type. For this purpose, reference is again made, for example, to Finkenzeller, see particularly page 108, or the data book: ATMEL, Data Book 2001, ICs for wireless control systems, pages 326ff.

In summary, the field strength or the distance is determined as follows:

In a first step, switching unit 215 is activated by microprocessor 205 such that antenna circuit 214 is supplied with the reference input value UI. The reference input value UI can be permanently active or activated solely for the measuring process. Here, it should be known or made certain that the carrier signal is not active.

Next, the arising output voltage UAI is measured and stored.

After storage of output voltage UAI generated by turning on reference voltage source 216, switching unit 215 is activated by microprocessor 205 in such a way that antenna circuit 214 is decoupled from the reference input value UI. The now arising output voltage UAF is produced by the field of the carrier signal at antenna coil 202.

The actual field strength, i.e., the field strength at which an effect of the characteristic parameters is compensated, is calculated by forming the ratio of UAF and UAI and multiplying by the known voltage UI.

For the final distance measurement, the specific field strengths, determined as described above, of antennas 202, 203, and 204 are superposed for calculating a total field strength, which is independent of the orientation. The distance is finally calculated using Equation (6) from the total field strength calculated by conventional vector calculus.

The measurement of the voltage UAI can be measured cyclically or triggered by certain events, as a result of which a change in the characteristic parameters of the antenna circuit, for example, due to a temperature drift, is taken into account.

It is understood that a current may also be used instead of the reference input value in the form of the voltage UI. For this purpose, switch 218 must remain closed in switching unit 215 during the measurement of the characteristic parameters and a reference current source supplies its current to a connection node between resistor 212 and capacitor 213.

In LF transmitter/receiver 201 of FIG. 2, other circuit parts can be provided in addition to antenna circuit 214. For example, an integrated circuit can be provided, which is designed for coupling to antenna circuit 214. The integrated circuit can then take over, for example, the evaluation of the output voltage UAF or UAI instead of microprocessor 205. In other words, the entire evaluation of the output voltage UAI and UAF occurs in the integrated circuit, as a result of which the evaluation in microprocessor 205 is simplified, because specific information is no longer necessary there. Furthermore, switching unit 215 and reference input value generating unit 216 can also be part of the integrated circuit.

The shown embodiments enable a precise, long-term stable field strength or distance measurement, without a laborious calibration being necessary during a manufacturing process.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for determining a field strength of a carrier signal at an antenna element of an antenna circuit of an electronic key, wherein the antenna circuit includes at least one circuit element and generates an output value, which is a function of the field strength and a function of characteristic parameters of the antenna circuit, the method comprising:
   generating a reference input value within said electronic key;
   supplying the antenna circuit with the reference input value;
   measuring the characteristic parameters, while the antenna circuit is supplied with the reference input value, wherein said characteristic parameters are directly related to values of said antenna element and said at least one circuit element forming said antenna circuit;
   storing the characteristic parameters;
   measuring a first output value of the antenna circuit; and
   determining the field strength as a function of the first output value and the characteristic parameters, wherein an effect of the characteristic parameters on the field strength is compensated.

2. The method according to claim 1, wherein the reference input value is generated in the form of a reference input voltage and/or a reference input current with a predefined reference frequency and reference amplitude, wherein a second output value is measured at an applied reference input value, and wherein the characteristic parameters are determined from the second output value.

3. The method according to claim 2, wherein, to determine the field strength, the quotient is formed from the first output value and the second output value.

4. The method according to claim 2, wherein the reference frequency is set equal to a frequency of the carrier signal.

5. The method according to claim 2, wherein the reference frequency is derived from a frequency of the carrier signal.

6. The method according to claim 1, wherein a distance between the antenna and a transmitting antenna of a transmitter of the carrier signal is determined from the determined field strength.

7. The method according to claim 6, wherein the field strength is determined at a second antenna and at a third antenna, wherein at least one of the antennas are perpendicular to another antenna and a distance between the antennas and a transmitting antenna of a transmitter of the carrier signal is determined from the determined field strengths.

8. The method according to claim 1, wherein the antenna and a transmitting antenna of a transmitter of the carrier signal are coupled mutually.

9. The method according to claim 1, wherein a parallel resonant circuit or a series resonant circuit is formed by the antenna circuit.

10. The method according to claim 1, wherein the frequency of the carrier signal is within a range of 50 KHz to 150 KHz or within a range of 5 MHz to 25 MHz.

11. A circuit arrangement for determining the field strength of a carrier signal, the circuit arrangement comprising:
   an antenna circuit with an antenna element and at least one circuit element and an output terminal at which an output value is applied in the form of an output voltage and/or a output current, which is a function of the field strength and a function of characteristic parameters of the antenna circuit, wherein said characteristic parameters are directly related to values of said antenna element and said at least one circuit element forming said antenna circuit;
   a reference input value generating unit for generating a reference input value in the form of a reference input voltage and/or a reference input current with a known reference frequency and reference amplitude; and
   an activatable switching unit, which is coupled to the antenna circuit and the reference input value generating unit and which supplies the antenna circuit with the reference input value as a function of the activation state or decouples the antenna circuit from the reference input value.

12. The circuit arrangement according to claim 11, wherein the reference input value generating unit is an oscillator.

13. The circuit arrangement according to claim 11, wherein an evaluation unit evaluates an output value when a reference input value is not applied, and evaluates an output value when a reference input value is applied for determining the field strength.

14. The circuit arrangement according to claim 11, wherein the antenna circuit has an antenna coil and a capacitor, which together form a parallel resonant circuit.

15. The circuit arrangement according to claim 11, wherein the antenna circuit is designed for a mutual coupling to a transmitting antenna of a transmitter of the carrier signal.

16. An integrated circuit for a key medium of a passive entry and/or a passive go system, wherein the integrated circuit is designed for coupling to a circuit arrangement according to claim 11.

17. A circuit arrangement for determining the field strength of a carrier signal, the circuit arrangement comprising:
   an antenna circuit with an antenna and an output terminal at which an output value is applied in the form of an output voltage and/or a output current, which is a function of the field strength and a function of characteristic parameters of the antenna circuit:

a reference input value generating unit for generating a reference input value in the form of a reference input voltage and/or a reference input current with a known reference frequency and reference amplitude; and an activatable switching unit, which is coupled to the antenna circuit and the reference input value generating unit and which supplies the antenna circuit with the reference input value as a function of the activation state or decouples the antenna circuit from the reference input value, wherein the antenna circuit has an antenna coil and a capacitor, which together form a parallel resonant circuit, and wherein the switching unit has a first switch, which is looped between a terminal of the capacitor and a reference potential, and a second switch, which is looped between the terminal of the capacitor and a terminal of the reference input value generating unit, at which the reference input value is applied.

18. A method for determining a distance between a base station and an electronic key based on a field strength of a carrier signal at an antenna of an antenna circuit of the electronic key, wherein the antenna circuit generates an output value that is a function of the field strength and a function of characteristic parameters of the antenna circuit, the method comprising:

determining a second output value as a measure of the characteristic parameters in that a reference input value is generated, the antenna circuit is supplied with the reference input value, the second output value of the antenna circuit is measured while the antenna circuit is supplied with the reference input value, and the second output value is stored; and measuring a first output value of the antenna circuit, the first output value being produced by a field of the carrier signal while the antenna circuit is not provided with the reference input value;

determining an actual field strength as a quotient of the first output value and the second output value; and determining the distance based on the actual field strength.

* * * * *